United States Patent
Ighani et al.

(10) Patent No.: US 6,369,609 B1
(45) Date of Patent: Apr. 9, 2002

(54) DEGENERATE NETWORK FOR PLD AND PLANE

(75) Inventors: Ramin Ighani, Santa Clara; Anup Nayak, Fremont, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/567,455

(22) Filed: May 8, 2000

(51) Int. Cl.[7] ............... H03K 19/173; H03K 19/177
(52) U.S. Cl. ............................... 326/41; 326/47
(58) Field of Search ..................... 326/38, 39, 41, 326/47

(56) References Cited

U.S. PATENT DOCUMENTS

| | | | |
|---|---|---|---|
| 4,159,512 A | * 6/1979 | Geerling | 363/21 |
| 4,933,736 A | 6/1990 | Conner et al. | 357/50 |
| 5,028,814 A | 7/1991 | Sung et al. | |
| 5,087,837 A | 2/1992 | Cline | |
| 5,144,582 A | * 9/1992 | Steele | 365/189.09 |
| 5,365,125 A | * 11/1994 | Goetting et al. | 326/39 |
| 5,714,890 A | 2/1998 | Cline | 326/40 |
| 5,789,945 A | 8/1998 | Cline | 326/94 |
| 5,889,416 A | * 3/1999 | Lovett | 326/121 |

* cited by examiner

*Primary Examiner*—Michael Tokar
*Assistant Examiner*—Daniel D. Chang
(74) *Attorney, Agent, or Firm*—Christopher P. Maiorana, P.C.

(57) ABSTRACT

A programmable logic device comprising one or more first stages and one or more second stages. The one or more first stages may comprise one or more gates of a first type each having a first number of inputs. The one or more second stages may comprise one or more gates of a second type each having a second number of inputs, wherein said first and second stages are interlaced.

20 Claims, 5 Drawing Sheets

US 6,369,609 B1

DEGENERATE NETWORK FOR PLD AND PLANE

FIELD OF THE INVENTION

The present invention relates to a method and/or architecture for an AND plane of a programmable logic device generally and, more particularly, to a method and/or architecture for a degenerate network for an AND plane of a programmable logic device.

BACKGROUND OF THE INVENTION

Referring to FIG. 1, a schematic diagram of a circuit 10 illustrating an implementation of an AND plane is shown. The circuit 10 illustrates a row of a 39-input AND plane. The circuit 10 provides for each of the 39 inputs (e.g., IT0–IT38) and a digital complement of each of 39 inputs (e.g., ITB0–ITB38) to be wire NORed. Seventy-eight configuration bits M control which of the inputs IT0–IT38 and complements ITB0–ITB38 are NORed. A sense amplifier 12 generates a row output in response to the wired NOR result.

Disadvantages of the sense amplifier 12 based AND plane include (i) sensitivity to the switching of a number of pull down paths, (ii) susceptibility to glitching, and (iii) continuous DC power consumption.

SUMMARY OF THE INVENTION

The present invention concerns a programmable logic device comprising one or more first stages and one or more second stages. The one or more first stages may comprise one or more gates of a first type each having a first number of inputs. The one or more second stages may comprise one or more gates of a second type each having a second number of inputs, wherein said first and second stages are interlaced.

The objects, features and advantages of the present invention include providing a method and/or architecture for a degenerate network for an AND plane of a programmable logic device that may (i) provide minimal skew, (ii) use symmetric gates, (iii) use a particular type of gate for each stage, (iv) connect un-used inputs to a voltage or ground supply, (v) provide minimal propagation delay, (vi) provide zero DC power consumption, (vii) provide glitch free operation and/or (v) provide a fully CMOS, degenerate N-input AND plane.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
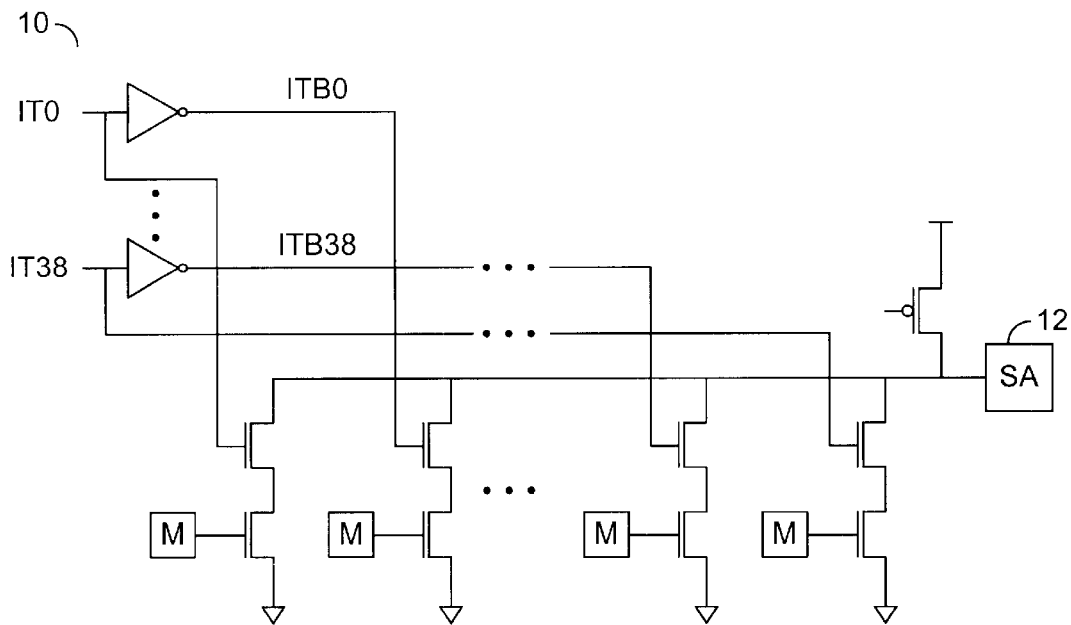
FIG. 1 is a schematic diagram illustrating a sense amplifier based circuit for generating a product term.
Figure 2:
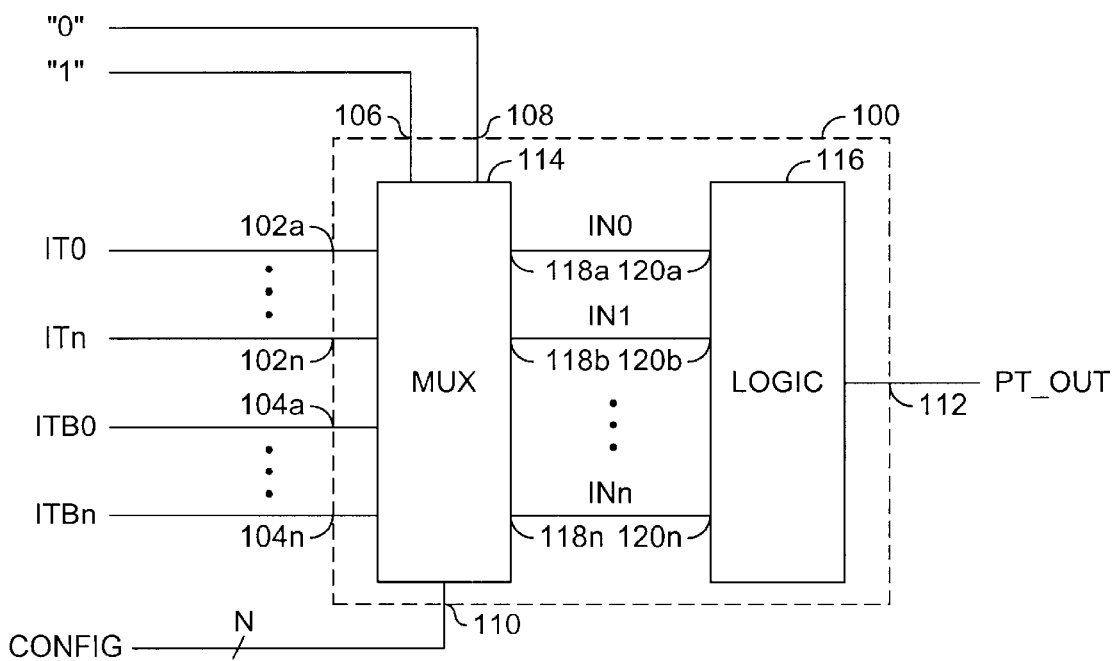
FIG. 2 is a block diagram of a preferred embodiment of the present invention.

Referring to FIG. 2, a block diagram of a circuit 100 is shown in accordance with a preferred embodiment of the present invention. The circuit 100 may be implemented, in one example, as a row of an AND array of a programmable logic device (PLD). The circuit 100 may have a number of inputs 102a–102n that may receive a signal (e.g., IT0–ITn), a number of inputs 104a–104n that may receive a digital complement of the signals IT0–ITn (e.g, ITB0–ITBn), an input 106 that may receive a logic level signal (e.g., a digital HIGH, or "1"), an input 108 that may receive a logic level (e.g., a digital LOW, or "0"), an input 110 that may receive a control signal (e.g., CONFIG), and an output 112 that may present a signal (e.g., PT_OUT). In one example, the circuit 100 may be configured to generate the signal PT_OUT in response to one or more of the signals IT0–ITn, the signals ITB0–ITBn, the logic level "1", the logic level "0", and the signal CONFIG. The signals IT0–ITn may be input terms of a programmable logic device. The signal PT_OUT may be, in one example, a product term signal. The signal CONFIG may be, in one example, N-bits wide where N is (i) an integer and (ii) generally twice the number of signals IT0–ITn. Each of the N bits may be a separate control signal. The signal CONFIG may comprise, in one example, configuration bits of a programmable logic device.

The circuit 100 may comprise a circuit 114 and a circuit 116. The circuit 114 may be implemented, in one example, as a multiplexer circuit. The circuit 116 may be implemented, in one example, as a logic circuit. The signals IT0–ITn and ITB0–ITBn, the logic levels "1" and "0", and the signal CONFIG may be presented to inputs of the circuit 114. The circuit 114 may have a number of outputs 118a–118n that may present a signal (e.g., IN0–INn) to a number of inputs 120a–120n of the circuit 116. The circuit 114 may be configured to select (i) one of the signals IT0–ITn, (ii) one of the signals ITB0–ITBn, (iii) the logic level "1", or (iv) the logic level "0" as the signals IN0–INn in response to the signal CONFIG.

The circuit 116 may be configured to generate the signal. PT_OUT in response to the signals IN0–INn. The signal PT_OUT may be a logical combination of the signals IN0–INn. In one example, the signal PT_OUT may be a result of a logical AND of the signals IN0–INn.

Figure 3:
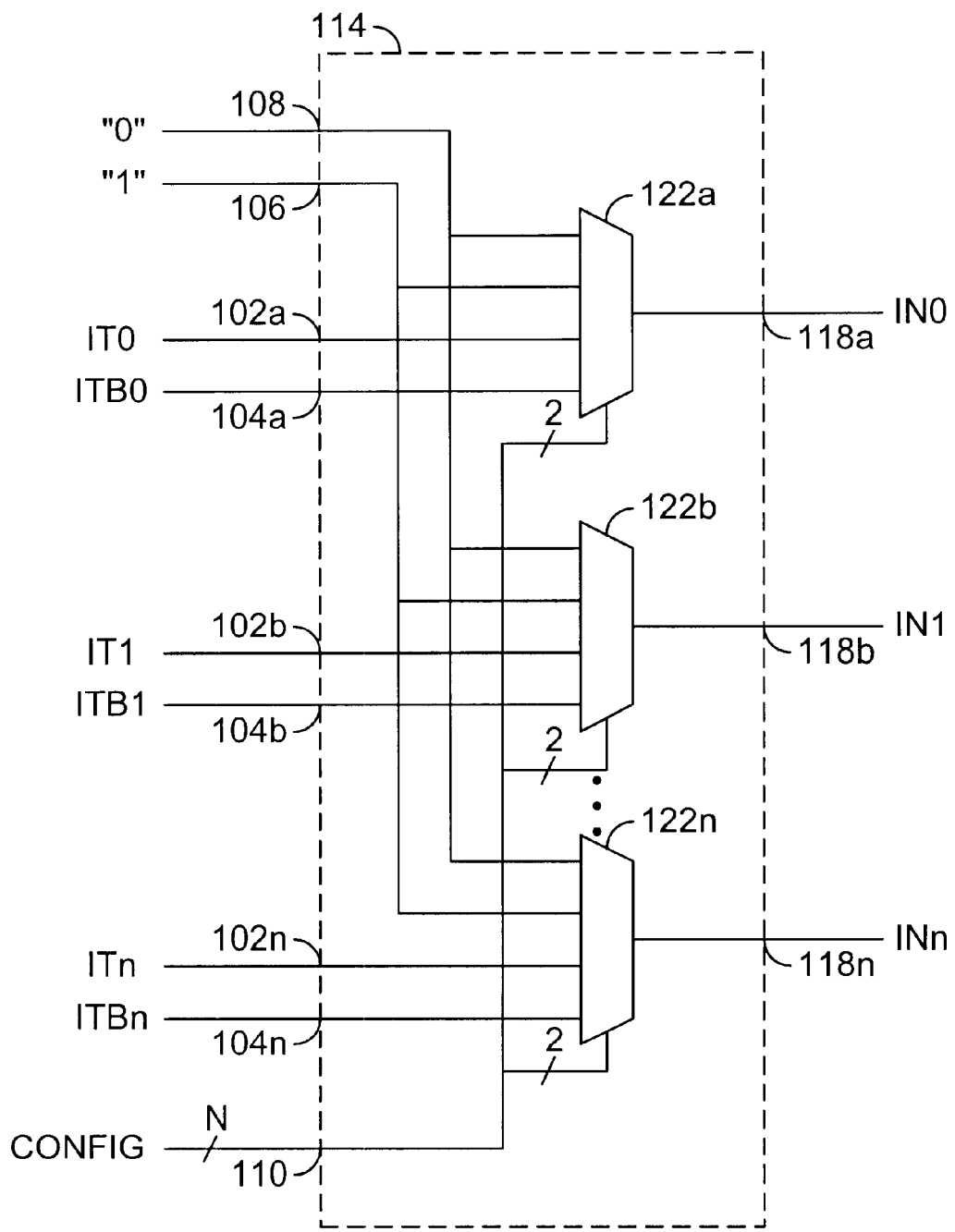
FIG. 3 is a block diagram illustrating a multiplexer circuit of FIG. 2.

Referring to FIG. 3, the circuit 114 may comprise, in one example, a number of multiplexer circuits 122a–122n. In one example, the circuits 122a–122n may be implemented as tri-state multiplexer circuits. Each of the multiplexer circuits 122a–122n may have a first input that may receive the logic level "0", a second input that may receive the logic level "1", a third input that may receive one of the signals IT0–ITn, a fourth input that may receive one of the signals ITB0–ITBn, a control input that may receive a number of bits of the signal CONFIG, and an output that may present one of the signals IN0–INn. For example, a tri-state multiplexer circuit 122i may be configured to select the signal ITi, the signal ITBi, the logic level "0", or the logic level "1" as the signal INi in response to the signal CONFIG.

Figure 4:
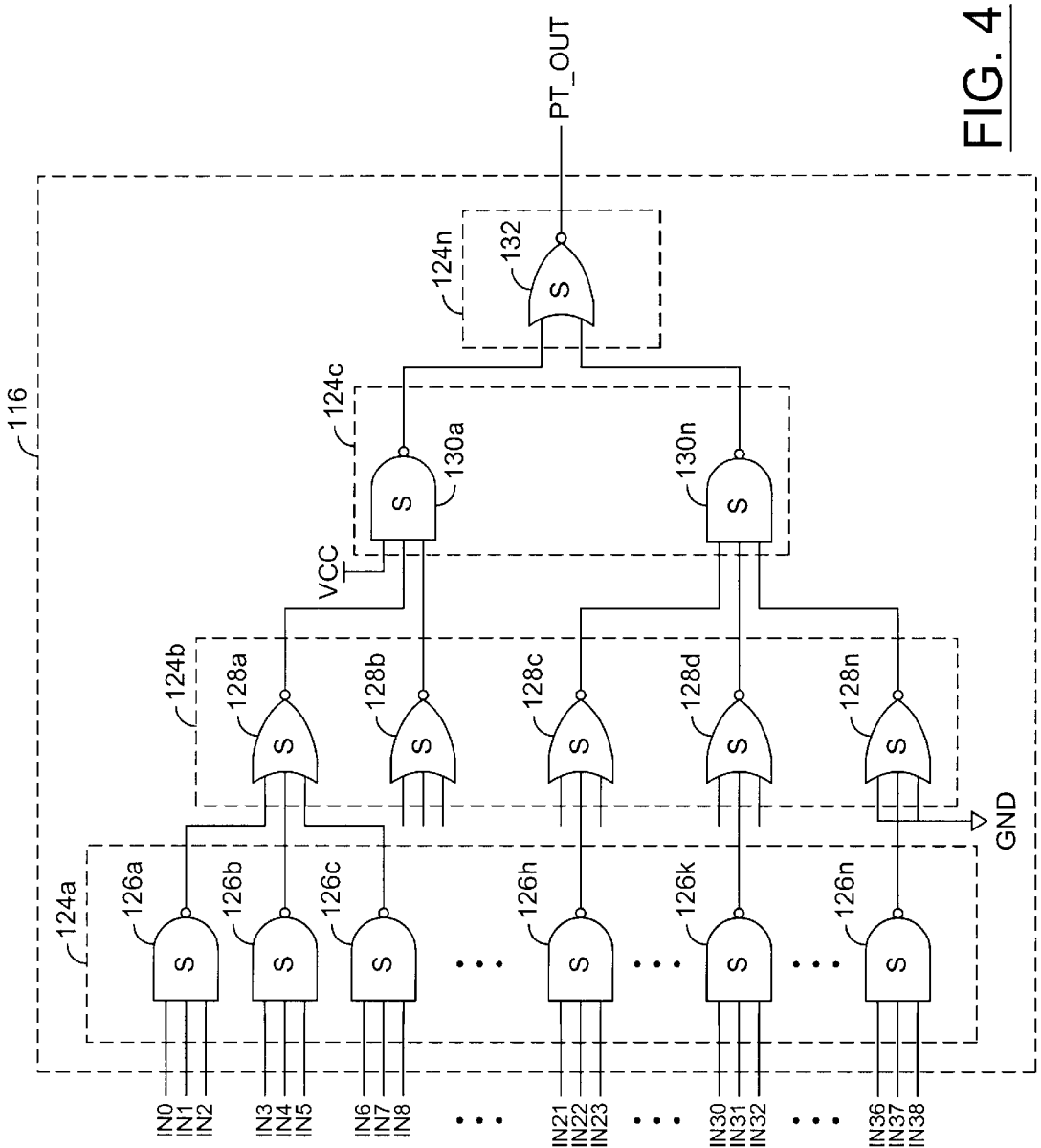
FIG. 4 is a block diagram illustrating a logic circuit of FIG. 2.

Referring to FIG. 4, a detailed block diagram illustrating an implementation of the circuit 116 is shown. The circuit 116 may be implemented, in one example, as a degenerate network of logic gates. The logic gates may be implemented as CMOS logic gates. The circuit 116 may comprise a number of logic stages 124a–124n. The number of logic stages 124a–124n may be varied to meet the design criteria of a particular application. The logic stages 124a–124n may be configured to generate a number of output signals in response to a logical combination of a number of input signals. The number of signals generated by a particular one of the stages 124a–124n may be smaller than the number of signals presented to the particular one of the stages 124a–124n. The output signals of a particular stage may be presented to the inputs of a next stage (e.g., 124a–124b, 124b–124c, ..., 124(n-1)–124n). In one example, the logic stages 124a–124n may alternate between NAND stages (e.g., 124a, 124c, etc.) and NOR stages (e.g., 124b, 124d, etc.). In another example, the stages 124a–124n may be interlaced starting with a NOR stage followed by a NAND stage, etcetera.

The stage 124a may comprise, in one example, a number of gates 126a–126n. The gates 126a–126n may be implemented, in one example, as 3-input symmetric NAND gates. However, other types of gates may be implemented accordingly to meet the design criteria of a particular application. Each of the signals IN0–INn may be presented to an input of the gates 126a–126n. For example, the signals IN0–IN2 may be presented to a first, a second and a third input of the gate 126a, respectively. The signals IN3–IN5 may be presented to a first, a second and a third input of the gate 126b, respectively. Similarly, the remaining signals IN6–INn may be presented to inputs of the remaining gates 126c–126n. In general, the gates 126a–126n may be chosen such that the total number of inputs of the gates 126a–126n matches the number of signals IN0–INn. Each of the gates 126a–126n may have an output that may present a signal to an input of the stage 124b.

The stage 124b may be configured to generate a number of output signals in response to a logical combination of the signals received from the stage 124a. The stage 124b may comprise, in one example, a number of gates 128a–128n. The gates 128a–128n may be implemented, in one example, as 3-input symmetric NOR gates. However, other types of gates may be implemented accordingly to meet the design criteria of a particular application. Each of the signals received from the stage 124a may be presented to an input of the gates 128a–128n. If the total number of inputs of the gates 128a–128n exceeds the number of signals presented by the circuit 124a, the unused inputs of the NOR gates 128a–128n may be connected to a supply voltage ground (e.g., GND). Each of the gates 128a–128c may have an output that may present a signal to an input of the stage 124c.

The stage 124c may be configured to generate a number of output signals in response to a logical combination of the signals received from the stage 124b. The stage 124c may comprise, in one example, a number of gates 130a–130n. The gates 130a–130n may be implemented, in one example, as 3-input symmetric NAND gates. However, other types of gates may be implemented accordingly to meet the design criteria of a particular application. Each of the signals received from the stage 124b may be presented to an input of the gates 130a–130n. If the total number of inputs of the gates 130a–130n exceeds the number of signals presented by the circuit 124b, the unused inputs of the NAND gates 130a–130n may be connected to a supply voltage (e.g., VCC). Each of the gates 130a–130n may have an output that may present a signal to an input of the stage 124n.

The stage 124n may comprise, in one example, a gate 132. The gate 132 may be implemented, in one example, as a 2-input NOR gate. However, other types of gates may be implemented accordingly to meet the design criteria of a particular application. The gate 132 may be configured to generate the signal PT_OUT in response to the signals received from the stage 124c.

In one example, the circuit 100 may be configured to provide a 39-input AND gate. When the number of signals IN0–INn is 39, the stage 124a may comprise thirteen 3-input NAND gates, the stage 124b may comprise five 3-input NOR gates, the stage 124c may comprise two 3-input NAND gates, and the stage 124n may comprise a 2-input NOR gate. However, other numbers of stages and gates may be implemented to meet the design criteria of a particular application.

Figure 5:
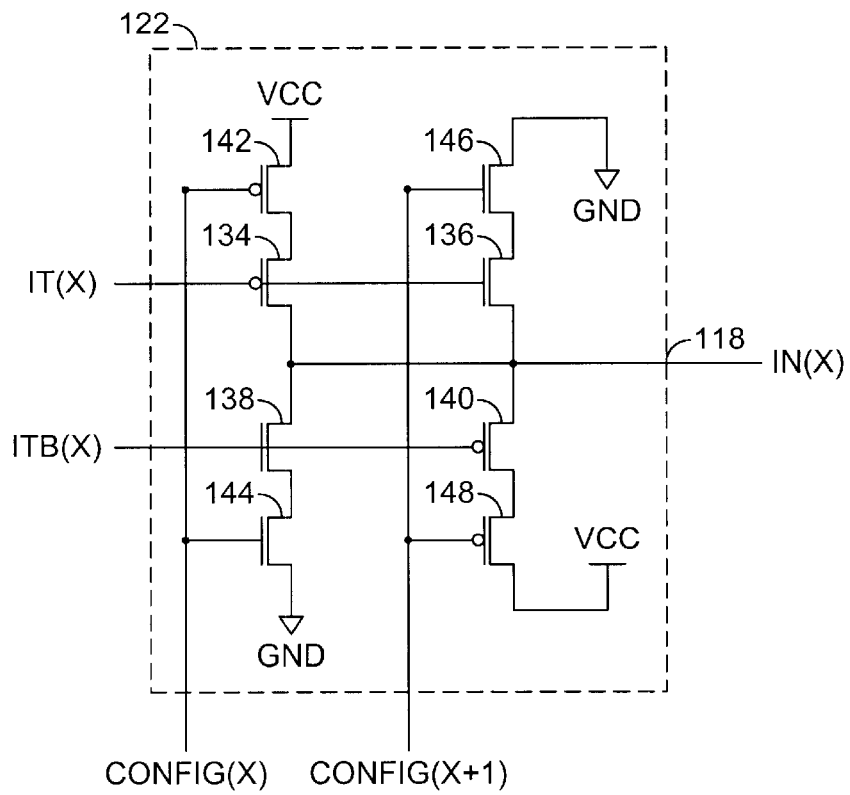
FIG. 5 is a schematic diagram illustrating a tri-state multiplexer circuit of FIG. 3.

Referring to FIG. 5, a schematic diagram of an example tri-state multiplexer circuit 122 of FIG. 3 is shown. The multiplexer circuit 122 may comprise a transistor 134, a transistor 136, a transistor 138, a transistor 140, a transistor 142, a transistor 144, a transistor 146, and a transistor 148. The transistors 134, 140, 142, 148 may be implemented, in one example, as one or more PMOS transistors. The transistors 136, 138, 144, and 146 may be implemented, in one example, as one or more NMOS transistors. However, other types and polarity transistors may be implemented to meet the design criteria of a particular application. The signal IT(x) may be presented to a gate of the transistors 134 and 136.

The signal ITB(x) may be presented to a gate of the transistors 138 and 140. A bit of the signal CONFIG may be presented to a gate of the transistors 142 and 144. Another bit of the signal CONFIG may be presented to a gate of the transistors 146 and 148. A source of the transistor 142 may be connected to a supply voltage (e.g., VCC). A drain of the transistor 142 may be connected to a source of the transistor 134. A drain of the transistor 134 may be connected to a drain of the transistor 136, a drain of the transistor 138, a drain of the transistor 140, and the output 118. A source of the transistor 138 may be connected to a drain of the transistor 144. A source of the transistors 144 and 146 may be connected to a ground voltage (e.g., GND). A drain of the transistor 146 may be connected to a source of the transistor 136. A source of the transistor 140 may be connected to a drain of the transistor 148. A source of the transistor 148 may be connected to the supply voltage VCC. Example operations of the circuit 122 may be summarized in the following TABLE 1:

TABLE 1

| CONFIG (x) | CONFIG (x + 1) | IT (x) | ITB (x) | IN (x) |
|---|---|---|---|---|
| 0 | 0 | 0 | X | 1 |
| 0 | 0 | X | 0 | 1 |
| 0 | 0 | 1 | 1 | high-z |
| 0 | 1 | X | X | IT (X) |
| 1 | 0 | X | X | ITB (x) |
| 1 | 1 | 1 | X | 0 |
| 1 | 1 | X | 1 | 0 |
| 1 | 1 | 0 | 0 | high-z |

Figure 6:
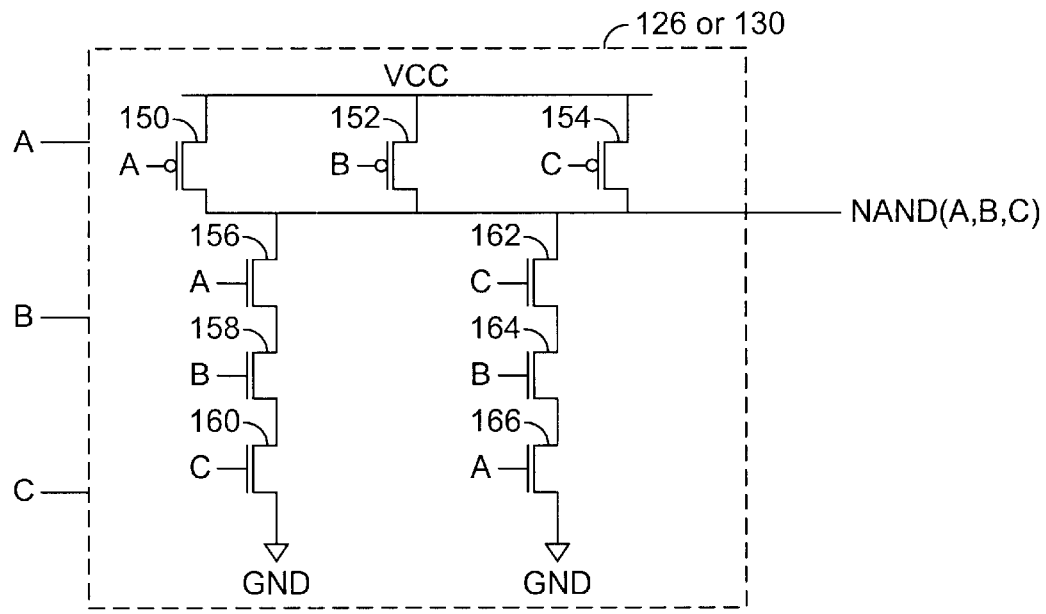
FIG. 6 is a schematic diagram illustrating a symmetric NAND gate circuit of FIG. 4.

Referring to FIG. 6, a schematic diagram illustrating a 3-input symmetric NAND gate of FIG. 3 is shown. The NAND gates 126 and 130 of FIG. 4 may comprise a transistor 150, a transistor 152, a transistor 154, a transistor 156, a transistor 158, a transistor 160, a transistor 162, a transistor 164, and a transistor 166. The transistors 150, 152, and 154 may be implemented, in one example, as one or more PMOS transistors. The transistors 156, 158, 160, 162, 164, and 166 may be implemented, in one example, as one or more NMOS transistors. However, other types and polarity transistors may be implemented to meet the design criteria of a particular application.

A first input signal (e.g., A) may be presented to a gate of the transistors 150, 156, and 166. A second input signal (e.g., B) may be presented to a gate of the transistors 152, 158, and 164. A third input signal (e.g., C) may be present to a gate of the transistors 154, 160, and 162. A source of the transistors 150, 152, and 154 may be connected to the supply voltage VCC. A drain of the transistors 150, 152, 154, 156, and 162 may be connected together to form a node that may present an output signal (e.g., NAND (A, B, C)) that may be the logical NAND of the input signals A, B, and C.

A source of the transistor 156 may be connected to a drain of the transistor 158. A source of the transistor 158 may be connected to a drain of the transistor 160. A source of the transistor 160 may be connected to the voltage supply ground GND. A source of the transistor 162 may be connected to a drain of the transistor 164. A source of the transistor 164 may be connected to a drain of the transistor 166. A source of the transistor 166 may be connected to the voltage supply ground GND.

Figure 7:
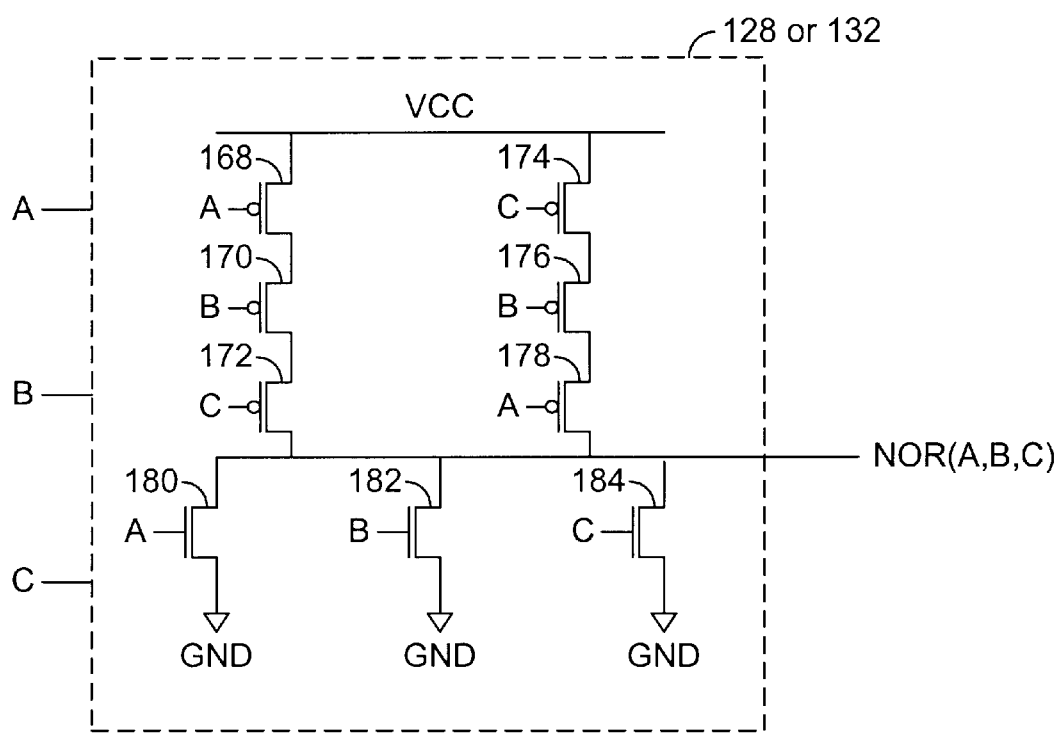
FIG. 7 is a schematic of a symmetric NOR gate circuit of FIG. 4.

Referring to FIG. 7, a schematic diagram illustrating a 3-input symmetric NOR gate of FIG. 3 is shown. The NOR gate 128 may comprise a transistor 168, a transistor 170, a transistor 172, a transistor 174, a transistor 176, a transistor 178, a transistor 180, a transistor 182, and a transistor 184. The transistors 168, 170, 172, 174, 176, and 178 may be implemented, in one example, as one or more PMOS transistors. The transistors 180, 182, and 184 may be implemented, in one example, as one or more NMOS transistors. However, other types and polarity transistors may be implemented to meet the design criteria of a particular application.

A first input signal (e.g., A) may be presented to a gate of the transistors 168, 178, and 180. A second input signal (e.g., B) may be presented to a gate of the transistors 170, 176, and 182. A third input signal (e.g., C) may be present to a gate of the transistors 172, 174, and 184. A source of the transistors 180, 182, and 184 may be connected to the ground potential GND. A drain of the transistors 172, 178, 180, 182, and 184 may be connected together to form a node that may present an output signal (e.g., NOR(A, B, C)) that may be the logical NOR of the input signals A, B, and C.

A source of the transistors 168 and 174 may be connected to the supply voltage VCC. A drain of the transistor 168 may be connected to a source of the transistor 170. A drain of the transistor 170 may be connected to a source of the transistor 172. A drain of the transistor 174 may be connected to a source of the transistor 176. A drain of the transistor 176 may be connected to a source of the transistor 178.

The present invention may provide, in one example, a full CMOS, degenerate 39-input AND gate. The AND gate may be configured, in one example, to generate a product term in response to (i) 39 true inputs, (ii) 39 complemented inputs, and (iii) 78 configuration bits. The present invention may provide the advantages of (i) minimal skew, (ii) minimal propagation delay, (iii) zero DC Power consumption, and/or (iv) glitch free operation.

While the invention has been particularly shown and described with reference to the preferred embodiments thereof, it will be understood by those skilled in the art that various changes in form and details may be made without departing from the spirit and scope of the invention.

What is claimed is:

1. A programmable logic device comprising:
   one or more first stages comprising one or more gates of a first type, each gate having a first number of inputs;
   one or more second stages comprising one or more gates of a second type, each gate having a second number of inputs, wherein said first and second stages are interlaced; and
   a multiplexer configured to select a first plurality of signals from (i) a plurality of input terms, (ii) digital complements of said plurality of input terms, and (iii) a logic level, in response to a plurality of control signals.

2. The programmable logic device according to claim 1, wherein said first and second number of inputs are the same or different.

3. The programmable logic device according to claim 1, wherein said first or second stages comprise NAND gates.

4. The programmable logic device according to claim 3, wherein said NAND gates have two or three inputs.

5. The programmable logic device according to claim 3, wherein un-used inputs of said NAND gates are connected to a supply voltage.

6. The programmable logic device according to claim 1, wherein said first or second stages comprise NOR gates.

7. The programmable logic device according to claim 6, wherein said NOR gates have two or three inputs.

8. The programmable logic device according to claim 6, wherein un-used inputs of said NOR gates are connected to a ground voltage.

9. The programmable logic device according to claim 1, wherein said gates are CMOS gates.

10. The programmable logic device according to claim 1, wherein said gates are symmetric gates.

11. A 39-input AND gate implemented in the programmable logic device according to claim 1, wherein:
   a first of said first stages comprises thirteen three-input symmetric NAND gates;
   a second of said first stages comprises two three-input symmetric NAND gates;
   a first of said second stages comprises five three-input symmetric NOR gates; and
   a second of said second stages comprises a two-input symmetric NOR gate.

12. A method for providing a degenerate network for an AND plane in a programmable logic device comprising the steps of:
   (A) generating a first number of signals in response to a second number of signals, wherein said first number is less than said second number, wherein said second number of signals are presented to a first stage comprising one or more gates of a first type having a first number of inputs;
   (B) generating a third number of signals in response to said first number of signals, wherein said third number is less than said first number, wherein said first number of signals are presented to a second stage comprising one or more gates of a second type having a second number of inputs; and
   (C) reprating (A) and (B) with subsequent stages until a single single is generated.

13. The method according to claim 12, wherein said first number of inputs and said second number of inputs are the same or different.

14. A programmable logic device comprising:
   one or more first stages comprising one or more gates of a first type, each gate having a first number of inputs;
   one or more second stages comprising one or more gates of a second type, each gate having a second number of inputs, wherein (i) said first and second stages are interlaced, (ii) a first of said first stages comprises thirteen three-input symmetric NAND gates, (iii) a second of said first stages comprises two three-input symmetric NAND gates, (iv) a first of said second stages comprises five three-input symmetric NOR gates and (v) a second of said second stages comprises a two-input symmetric NOR gate.

15. The programmable logic device according to claim 14, further comprising a circuit configured to select a first plurality of signals from (i) a plurality of input terms, (ii) digital complements of said plurality of input terms, and (iii) a logic level, in response to a plurality of control signals.

16. The programmable logic device according to claim 15, wherein said circuit comprises one or more multiplexer circuits.

17. The programmable logic device according to claim 16, wherein said multiplexer circuits are tri-state multiplexer circuits.

18. The programmable logic device according to claim 15, wherein said control signals comprise configuration bits.

19. The programmable logic device according to claim 15, wherein said logic level is a digital "1".

20. The programmable logic device according to claim 15, wherein said logic level is a digital "0".

* * * * *